United States Patent
Singla et al.

(10) Patent No.: US 8,539,413 B1
(45) Date of Patent: Sep. 17, 2013

(54) FREQUENCY OPTIMIZATION USING USEFUL SKEW TIMING

(75) Inventors: Sunil Kumar Singla, Ludhiana (Punjab) (IN); Balaji Prabhakar, Tamilnadu (IN)

(73) Assignee: Applied Micro Circuits Corporation, Sunnyvale, CA (US)

( * ) Notice: Subject to any disclaimer, the term of this patent is extended or adjusted under 35 U.S.C. 154(b) by 675 days.

(21) Appl. No.: 12/767,894

(22) Filed: Apr. 27, 2010

(51) Int. Cl.
*G06F 17/50* (2006.01)

(52) U.S. Cl.
USPC .......................... 716/113; 716/108; 716/114

(58) Field of Classification Search
USPC .......................................... 716/108, 113–114
See application file for complete search history.

(56) References Cited

U.S. PATENT DOCUMENTS

| | | | | |
|---|---|---|---|---|
| 5,648,913 A * | 7/1997 | Bennett et al. | ............. | 716/113 |
| 6,550,044 B1 * | 4/2003 | Pavisic et al. | ............. | 716/114 |
| 6,550,045 B1 * | 4/2003 | Lu et al. | ............. | 716/114 |
| 6,591,407 B1 * | 7/2003 | Kaufman et al. | ............. | 716/114 |
| 6,799,308 B2 * | 9/2004 | You et al. | ............. | 716/113 |
| 6,810,515 B2 * | 10/2004 | Lu et al. | ............. | 716/104 |
| 6,826,733 B2 * | 11/2004 | Hathaway et al. | ............. | 716/134 |
| 6,941,541 B2 * | 9/2005 | Snider | ............. | 716/103 |
| 7,191,419 B2 * | 3/2007 | Soreff et al. | ............. | 716/113 |
| 7,203,919 B2 * | 4/2007 | Suaris et al. | ............. | 716/108 |
| 7,296,246 B1 * | 11/2007 | Kuehlmann et al. | ............. | 716/108 |
| 7,305,644 B2 * | 12/2007 | Curtin et al. | ............. | 716/113 |
| 7,363,606 B1 * | 4/2008 | Mo et al. | ............. | 716/114 |
| 7,376,924 B2 * | 5/2008 | Curtin et al. | ............. | 716/122 |
| 7,546,567 B2 * | 6/2009 | Cheon et al. | ............. | 716/113 |
| 7,650,580 B2 * | 1/2010 | Kucukcakar et al. | ............. | 716/100 |
| 7,843,218 B1 * | 11/2010 | Ramaraju et al. | ............. | 326/46 |
| 7,937,604 B2 * | 5/2011 | Banerji et al. | ............. | 713/401 |
| 7,992,116 B2 * | 8/2011 | Chang | ............. | 716/113 |
| 8,185,865 B2 * | 5/2012 | Gupta et al. | ............. | 716/139 |
| 2006/0247906 A1 * | 11/2006 | Austin et al. | ............. | 703/16 |
| 2007/0089076 A1 * | 4/2007 | Amatangelo | ............. | 716/6 |
| 2007/0226668 A1 * | 9/2007 | Dasdan et al. | ............. | 716/6 |
| 2010/0169846 A1 * | 7/2010 | Gupta et al. | ............. | 716/2 |

* cited by examiner

*Primary Examiner* — Naum Levin
(74) *Attorney, Agent, or Firm* — Turocy & Watson, LLP (57) ABSTRACT

A circuit analysis tool is provided for optimizing circuit clock operating frequency using useful skew timing analysis. The instructions supply clock signal with an optimized operating frequency. A first gate signal input slack time is determined with respect to the clock signal to the first gate. If the first gate signal input has a negative slack time, a delay is added to the first clock signal. A second gate signal input slack time is determined with respect to the clock signal to the second gate. If the second gate signal input slack time is negative, a delay is added to the second clock signal necessary to create a second gate signal input positive slack time. In response to the first and second gate signal input positive slack times, it is determined that the circuit successfully operates at the clock optimized operating frequency.

10 Claims, 10 Drawing Sheets

FREQUENCY OPTIMIZATION USING USEFUL SKEW TIMING

BACKGROUND OF THE INVENTION

1. Field of the Invention

This invention generally relates to signal networking and, more particularly, to a system and method for minimizing circuit leakage current while maximizing the clock operating frequency.

2. Description of the Related Art

The size, complexity, and operating or switching speeds of semiconductor ICs have increased, while feature geometries have decreased, and interconnect systems for such ICs have dramatically increased in complexity. In a digital circuit, data is suppose to move in lockstep, advancing one stage on each tick of the clock signal. This is enforced by synchronizing elements such as flip-flops or latches, which copy their input to their output when instructed to do so by the clock.

As noted in Wikipedia, one approach that is used to analyze timing errors is to model the interconnect system as an arrangement of nets (interconnections between gate outputs and interconnected gate inputs) inter-coupled with parasitic capacitors. Static Timing Analysis (STA) is used to develop early and late arrival times (timing window) for each relevant net or node. This timing window is enlarged by a worst case assessment of crosstalk noise for both early and late arrival times using noise aware STA. This worst case timing window is used for timing analysis of all paths through the corresponding net and a list of paths that fail timing requirements are provided. In static timing analysis, the word static alludes to the fact that this timing analysis is carried out in an input-independent manner, and purports to find the worst-case delay of the circuit over all possible input combinations.

More explicitly, STA is a method of computing the expected timing of a digital circuit without performing a simulation. High-performance ICs have conventionally been characterized by the clock frequency at which they operate. Gauging the operation of a circuit at a specified speed requires an ability to measure, during the design process, its delay at numerous steps. Moreover, delay calculations must be incorporated into the inner loop of timing optimizers at various phases of design, such as logic synthesis, layout (placement and routing), and in in-place optimizations performed late in the design cycle. While such timing measurements can theoretically be performed using a rigorous circuit simulation, such an approach is liable to be too slow to be practical. Static timing analysis plays a vital role in facilitating the fast and reasonably accurate measurement of circuit timing. The main goal of static timing analysis is to verify that despite these possible variations, all signals will arrive neither too early nor too late, and hence proper circuit operation can be assured. Faster design times are a result of using simplified STA delay models, and a limited consideration of the effects of logical interactions between signals.

Also, since STA is capable of verifying every path, apart from helping locate setup and hold time violations, it can detect other serious problems like glitches, slow paths and clock skew. The critical path is defined as the path between an input and an output with the maximum delay. Once the circuit timing has been computed by one of the techniques below, the critical path can easily be found by using a traceback method. The arrival time of a signal is the time elapsed for a signal to arrive at a certain point. The reference, or time 0.0, is often taken as the arrival time of a clock signal. To calculate the arrival time, delay calculation of all the components in the path is required. Arrival times, and indeed almost all times in timing analysis, are normally kept as a pair of values—the earliest possible time at which a signal can change, and the latest.

Required time is the latest time at which a signal can arrive without making the clock cycle longer than desired. The computation of the required time proceeds as follows. At each primary output, the required times for rise/fall are set according to the specifications provided to the circuit. Next, a backward topological traversal is carried out, processing each gate when the required times at all of its fanouts are known. The slack associated with each connection is the difference between the required time and the arrival time. A positive slack (s) at a node implies that the arrival time at that node may be increased by (s) without affecting the overall delay of the circuit. Conversely, negative slack implies that a path is too slow, and the path must be sped up (or the reference signal delayed) if the whole circuit is to work at the desired speed.

The behavior of an electronic circuit is often dependent on various factors in its environment like temperature or local voltage variations. In such a case either STA needs to be performed for more than one such set of conditions, or STA must be prepared to work with a range of possible delays for each component, as opposed to a single value. If the design works at each extreme condition, then under the assumption of monotonic behavior, the design is also qualified for all intermediate points.

The use of corners in static timing analysis has several limitations. It may be overly optimistic, since it assumes perfect tracking—if one gate is fast, all gates are assumed fast, or if the voltage is low for one gate, it's also low for all others. Corners may also be overly pessimistic, for the worst case corner may seldom occur. In an IC, for example, it may not be rare to have one metal layer at the thin or thick end of its allowed range, but it would be very rare for all 10 layers to be at the same limit, since they are manufactured independently. Statistical STA, which replaces delays with distributions, and tracking with correlation, is a more sophisticated approach to the same problem.

Conventionally, slow signal path timing errors can be corrected by using higher performance parts. Gates made with a low threshold voltage (Vt) are faster, so the frequency targets are sometimes met with the use of Low-Vt cells (gates) in the most timing critical paths. However, these parts have a higher leakage current, which increases power consumption and device temperature. Therefore, careful designing is done to limit the use of Low-Vt cells. The ratio of leakage current for High-Vt to Low-Vt can vary from 1:10 to 1:30, or even higher. Also, if Low-Vt cells are specifically used for meeting the frequency targets, then the device fabrication incurs an additional mask cost for the Low-Vt diffusion layer, adding to the overall cost of chip fabrication.

It would be advantageous if there was a systematic approach to determine if the clock operating frequency of a circuit could be increased, while minimizing the use low Low-Vt cells.

SUMMARY OF THE INVENTION

Disclosed herein is a method for increasing the frequency of operation of the SoC, while minimizing the use of Low-Vt gates (cells). Low-Vt gates have a huge impact on the power, which sharply limits their use in the physical design of an IC (integrated circuit). An increase in the system frequency can be, but is not always, beneficial to the throughput of the system. An increase in frequency increases the overall power consumption of the IC, especially if Low-Vt gates are needed in the design. Low-Vt gates additionally impact power consumption, as they have a relatively high leakage current. The disclosed method aids in slack time calculations, so that a minimum number of Low-Vt gates can be used to support system timing.

Accordingly, a circuit analysis tool is provided, enabled with software instructions, for optimizing circuit clock operating frequency using useful skew timing analysis. The instructions provide a circuit having a first gate with a signal input to accept a test signal, a clock input, and a signal output. A first circuit element has an input connected to the first gate output, and an output, and first timing delay between the input and the output. A second gate has a signal input connected to the first circuit element output, a clock input, and a signal output. The instructions supply clock signal with an optimized operating frequency. A first gate signal input slack time is determined with respect to the clock signal to the first gate. If the first gate signal input has a negative slack time, which is a time occurring subsequent to the clock signal to the first gate, a delay is added to the first clock signal necessary to create a first gate signal input positive slack time, which is a time occurring before the clock signal to the first gate. A second gate signal input slack time is determined with respect to the clock signal to the second gate. If the second gate signal input slack time is negative, a delay is added to the second clock signal necessary to create a second gate signal input positive slack time. In response to the first and second gate signal input positive slack times, it is determined that the circuit successfully operates at the clock optimized operating frequency.

Additional details of the above-described method and a system of hardware devices connected with minimal signal crosstalk are provided below.

DETAILED DESCRIPTION

Figure 1A:
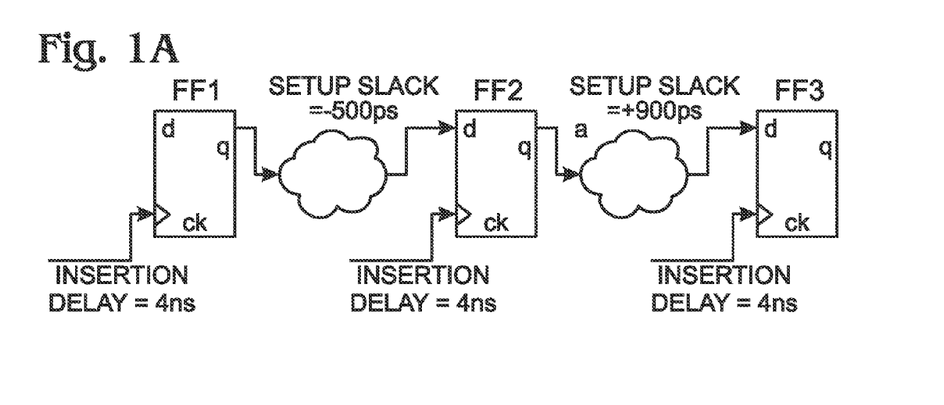
FIGS. 1A and 1B depict a delaying capture clock.
Figure 1B:
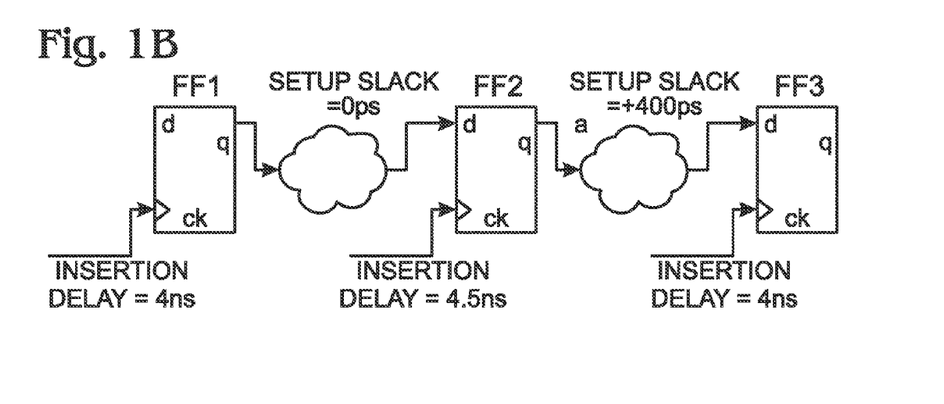

FIGS. 1A and 2B depict a delaying capture clock. Useful skew is sometime used by designers to close the timing in a system-on-chip (SoC). In this concept, the launch clock is advanced, or the capture clock is delayed, to meet the setup requirement of the design. As shown in FIG. 1A, the flop FF2 is violating setup slack by 500 picoseconds (ps) (shown as −500 ps) while the next stage flop FF3 is meeting the setup slack by 900 ps (shown as +900 ps). Since 900 ps is greater than 500 ps, the clock of flop FF2 can be delayed by 500 ps to meet the setup slack, as shown in FIG. 1B. This is called a delaying capture clock.

Figure 2A:
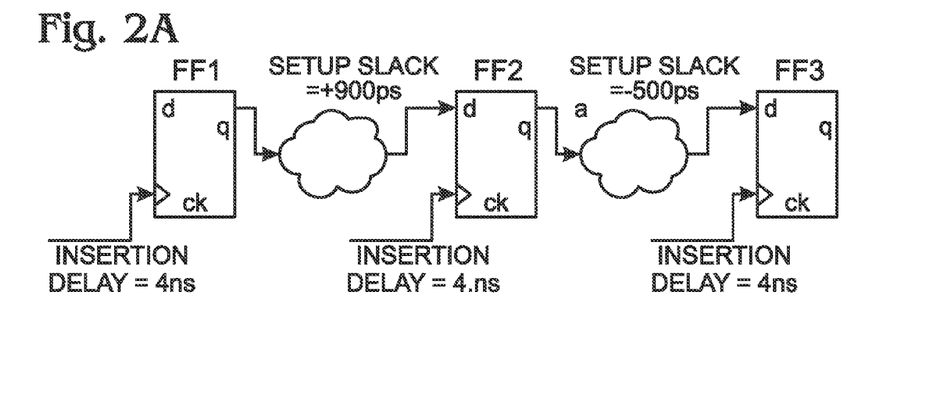
FIGS. 2A and 2B depict an advancing launch clock.
Figure 2B:
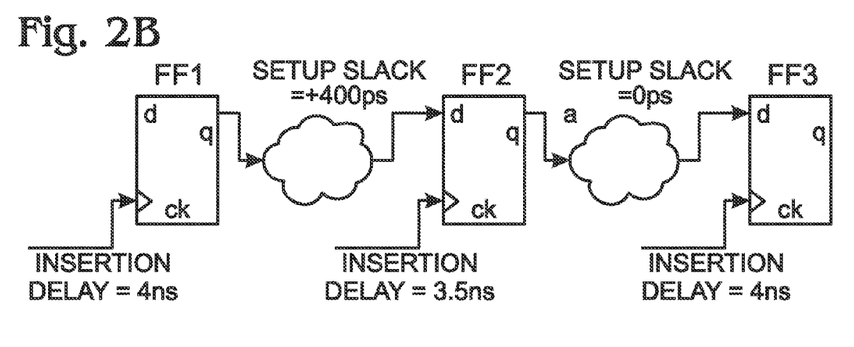

FIGS. 2A and 2B depict an advancing launch clock. As shown in FIG. 2A, FF3 is violating setup slack by −500 ps. However, the clock of flop FF2 can be advanced to meet the setup slack, as shown in FIG. 2B.

However, if positive slack (more than the absolute value of the negative slack) is not available in the preceding or the next stage of flops (e.g., 900 ps positive slack with respect to 500 ps negative slack), these techniques cannot be used.

Figure 3:
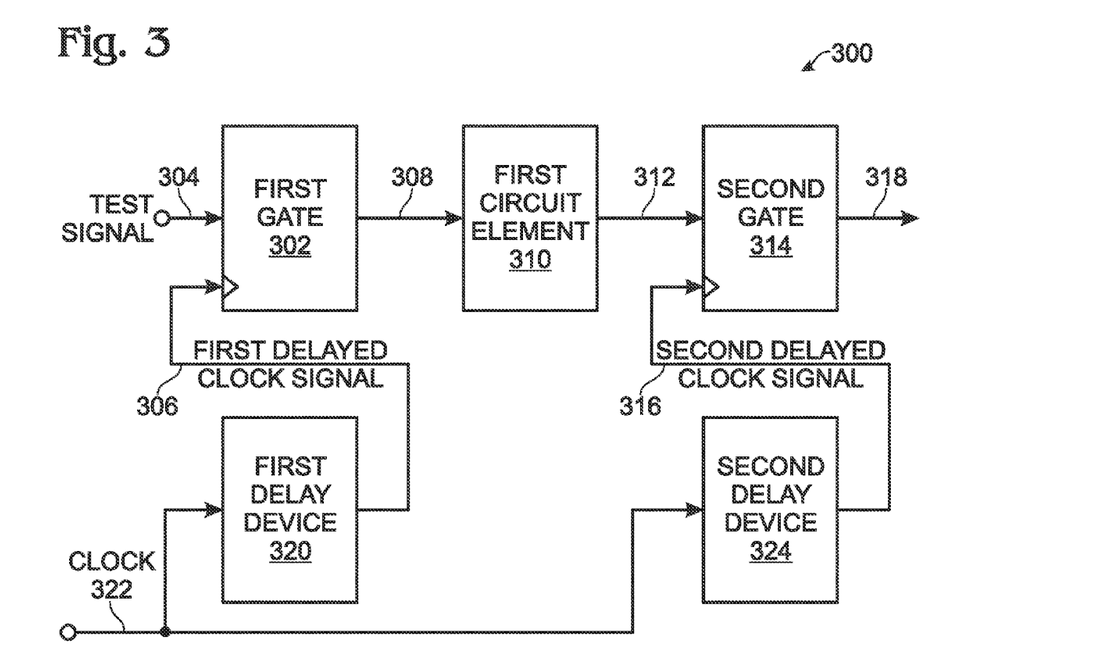
FIG. 3 is a schematic block diagram of a system of connected hardware devices operating at an optimized frequency clock with positive slack times.

FIG. 3 is a schematic block diagram of a system of connected hardware devices operating at an optimized frequency clock with positive slack times. The system 300 comprises a first gate 302 having a signal input on line 304 to accept a test signal, a clock input on line 306 to receive a first delayed clock signal, and a signal output on line 308. A first circuit element 310 has a signal input connected to the first gate output on line 308, an output on line 312, and timing delay between the input and the output.

A second gate 314 has a signal input connected to the first circuit element output on line 312, a clock input on line 316 to receive a second delayed clock signal, and a signal output on line 318. A first delay device 320 has an input on line 322 connected to receive a clock signal with an optimized operating frequency, and an output to supply the first delayed clock signal on line 306. A second delay device 324 has an input on line 322 connected to receive the clock signal with the optimized operating frequency, and an output on line 316 to supply the second delayed clock signal. The first gate signal input has a positive slack time, which is a time occurring before the first delayed clock signal. The second gate signal input also has a positive slack time. For simplicity, it can be assumed that the first and second gates are a flip/flop, latch, or other circuit requiring a clock to advance a signal from input to output. The first circuit element can be a logic gate, passive circuit element, or active circuit element.

In one aspect, the first gate signal input on line 304 initially has a negative slack time with respect to the clock optimized frequency, which is a time occurring subsequent to the first gate signal input. That is, the test signal arrives after the clock signal. To remedy this problem, the first delay device 320 is added to the system. Alternately stated, the delay of the first delay device 320 is selected to create the first gate signal input positive slack time. Note: if the negative slack time cannot be remedied by delaying the clock signal, then the circuit may be unable to operate with the optimized frequency, and a lower clock frequency may be necessary.

In another aspect, the second gate signal input may have a negative slack time with respect to the clock optimized frequency. Again, the delay of the second delay device 324 is selected to create the second gate signal input positive slack time. Note: in other examples, it is possible for the first gate signal input to have a negative slack time with respect to the clock signal, while the second gate signal input has a positive slack time. Likewise, it is possible for the second gate signal input to have a negative slack time with respect to the clock signal, while the first gate signal input has a positive slack time.

Figure 4:
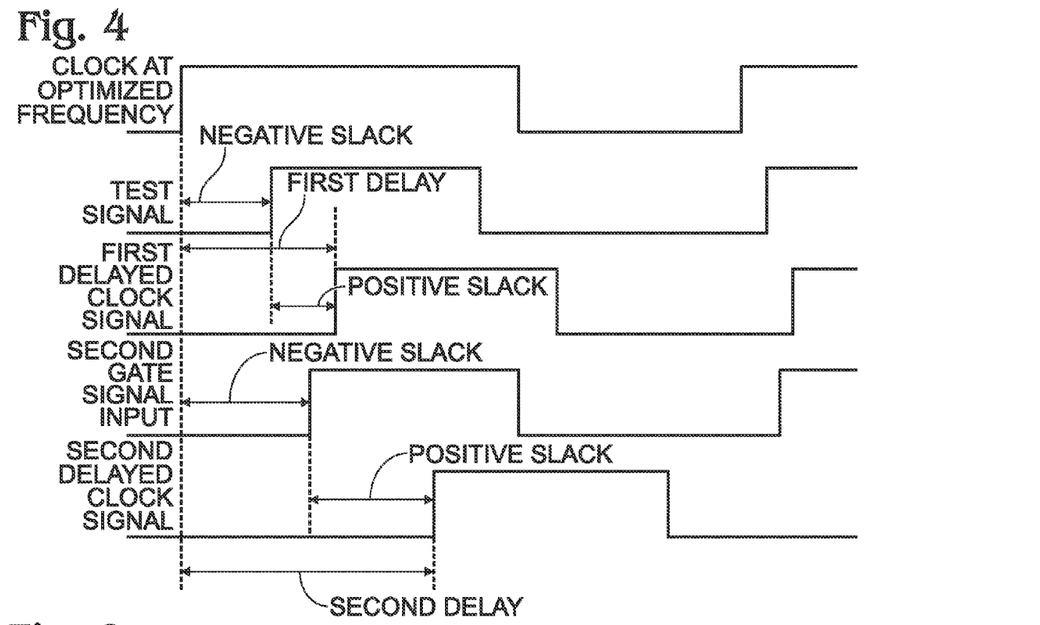
FIG. 4 is a timing diagram depicting the slack times associated with the system of FIG. 3.

FIG. 4 is a timing diagram depicting the slack times associated with the system of FIG. 3.

Figure 5:
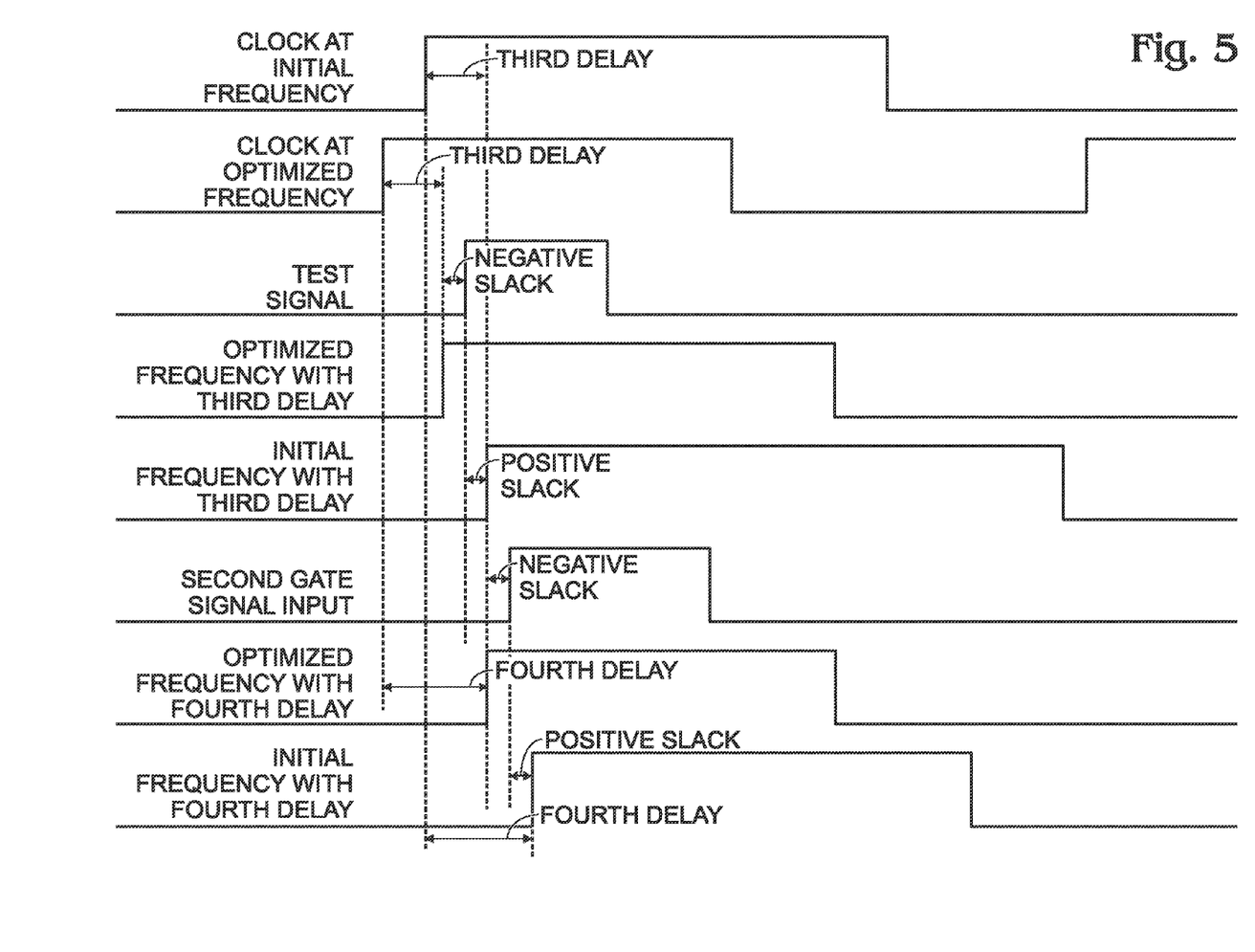
FIG. 5 is a timing diagram additionally depicting initial slack times associated with the system of FIG. 3.

FIG. 5 is a timing diagram additionally depicting initial slack times associated with the system of FIG. 3. Contrasting FIGS. 3 and 5, the first delay circuit 320 initially has a third delay, less than the first delay. The first gate input signal slack time is positive in response to the first delay circuit accepting a clock signal with an initial operating frequency, slower than the optimized operating frequency, and negative with respect to the first delay circuit accepting the clock signal with the optimized operating frequency. In other words, the first gate signal input initially has a positive slack when the initial operating frequency is used, but when the optimized operating frequency is used, the delay in the first delay device must be increased.

Likewise, the second delay circuit may initially have a fourth delay, less than the second delay. The second gate input signal slack time is positive in response to the second delay circuit accepting the clock signal with the initial operating frequency, and negative with respect to the second delay circuit accepting the clock signal with the optimized operating frequency. In other words, the second gate input signal initially has a positive slack when the initial operating frequency is used, but when the optimized operating frequency is used, the delay in the second delay device must be increased.

Figure 6:
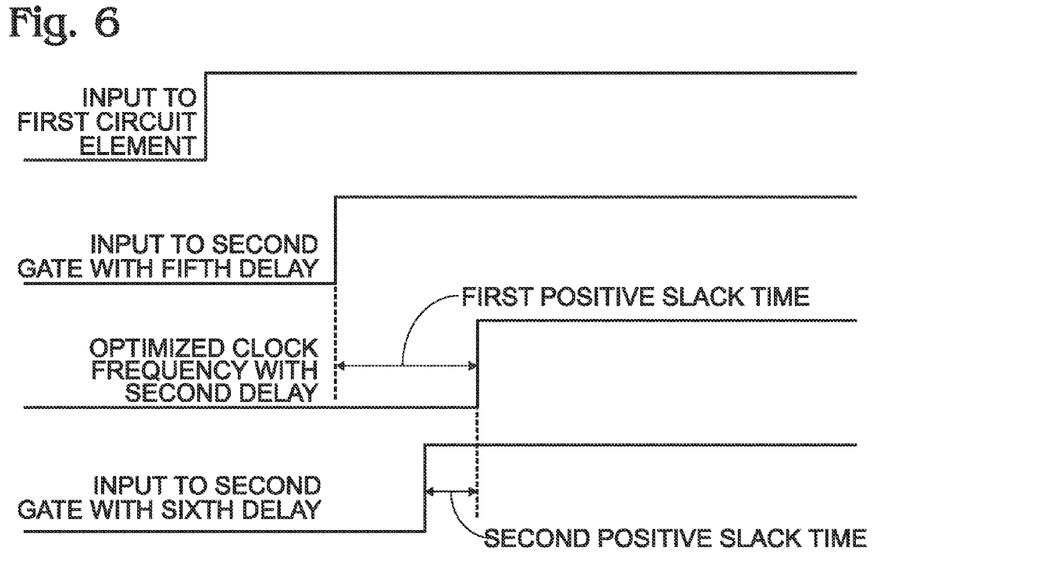
FIG. 6 is a timing diagram depicting slack times in the system of FIG. 3 in response to changing the threshold voltage of the first circuit element.

FIG. 6 is a timing diagram depicting slack times in the system of FIG. 3 in response to changing the threshold voltage of the first circuit element. In another aspect, the first circuit element 310 initially has a fifth timing delay and a first threshold voltage, and the second gate signal input initially has a first positive slack time in response to the fifth timing delay. Then, the first circuit element 310 is modified to have a sixth timing delay, greater than the fifth timing delay, and a second threshold voltage, higher than the first threshold voltage. The second gate signal input has a second positive slack time, less than the first positive slack time, in response to the sixth timing delay. In other words, because of the margin associated with the first positive slack time, the threshold voltage of the first circuit element can be increased without violating the system timing.

Functional Description

FIGS. 3 through 6 depict some of the results that can be obtained by increasing in the frequency of the chip during the physical design by finding the positive slack in the timing paths, and redistributing this positive setup slack into timing paths with violated timing caused by an increase in the frequency of the chip in the STA environment.

Figure 7A:
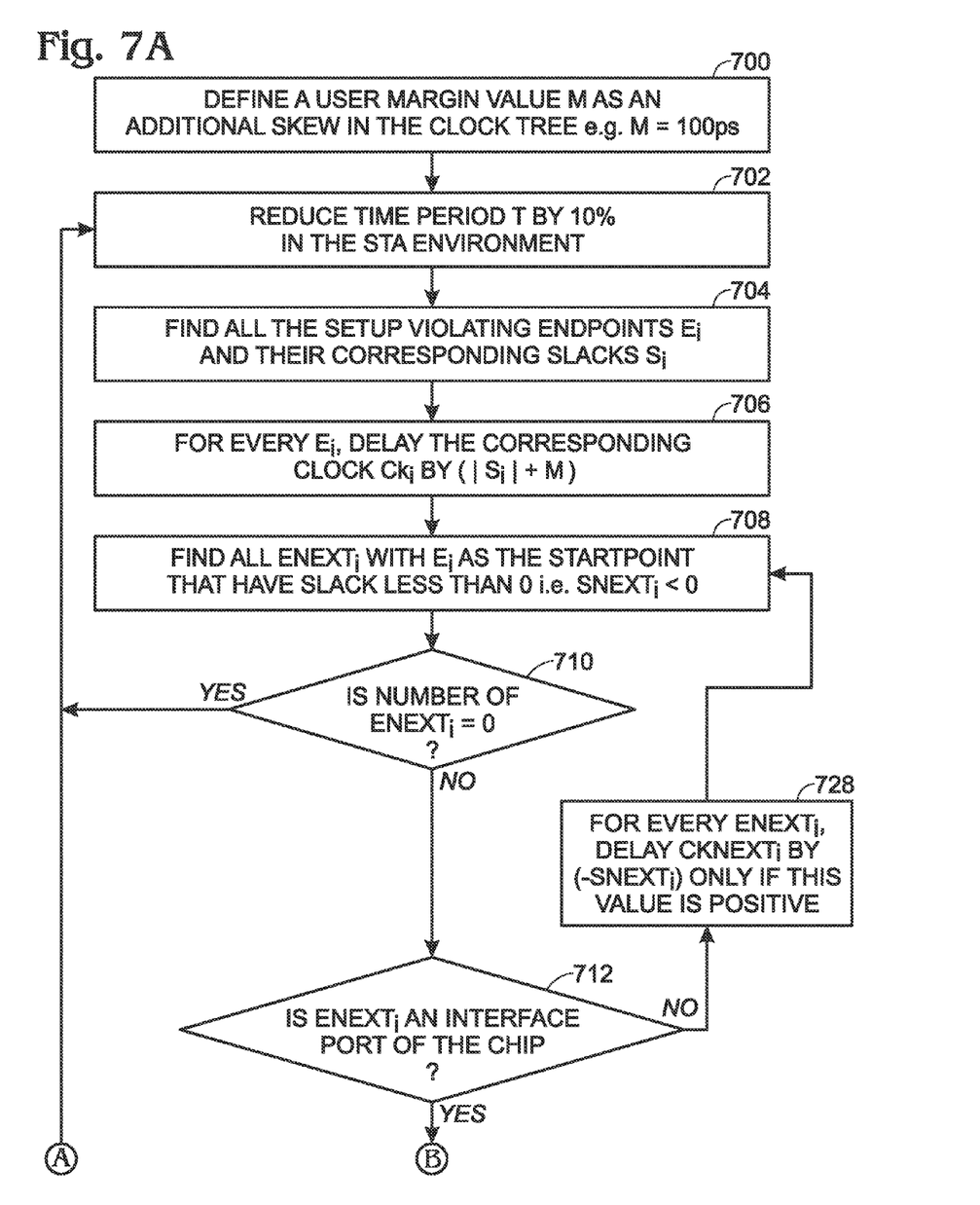
FIGS. 7A and 7B are a flowchart illustrating a methodology for increasing device operating frequency while minimizing leakage current.
Figure 7B:
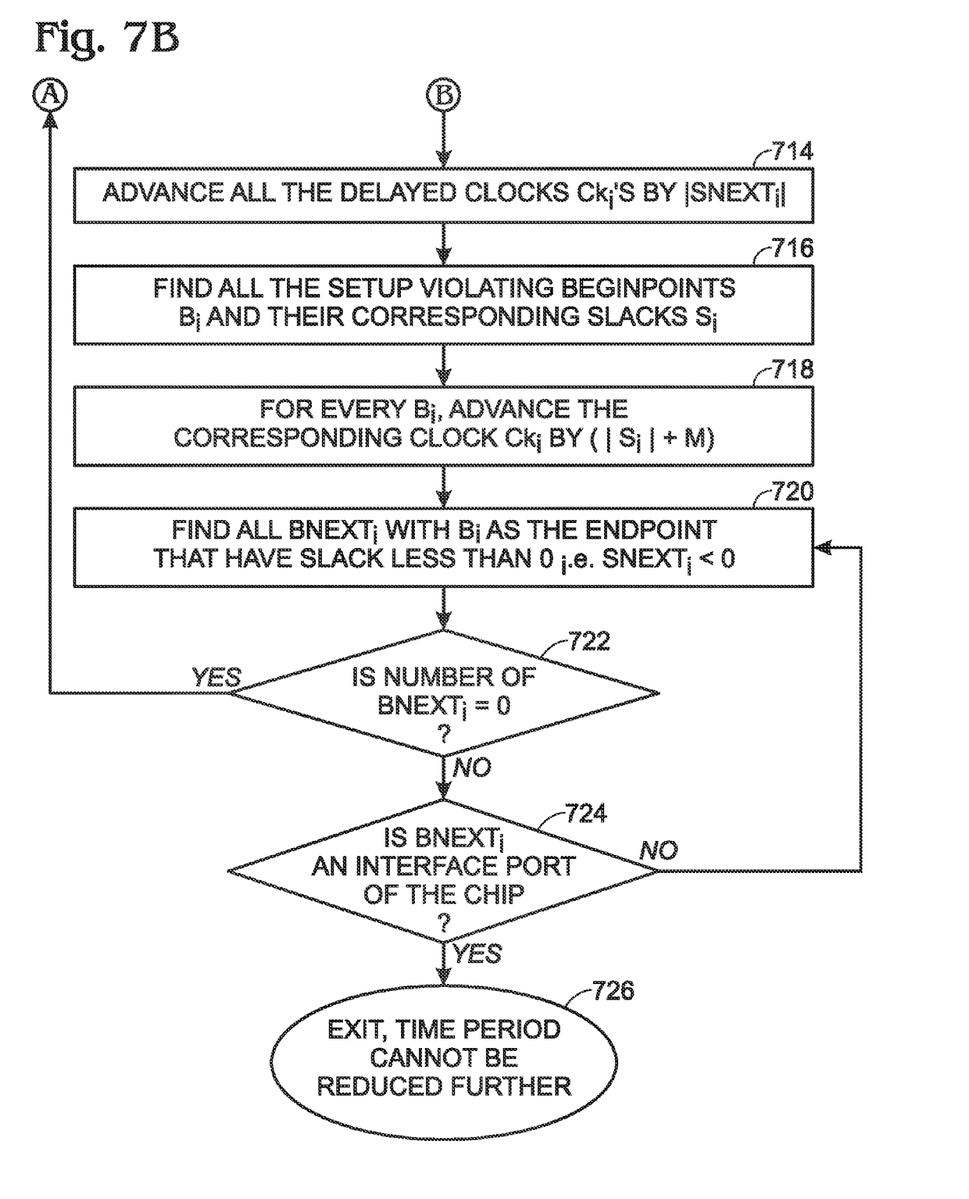

FIGS. 7A and 7B are a flowchart illustrating a methodology for increasing device operating frequency while minimizing leakage current. Note: the frequencies and frequency increments described below are just examples. These values can also be a user-defined variable depending upon the smallest step in time period (frequency) supported by the frequency generator or phase-locked loop (PLL) in the chip, or a step in frequency supported by the design.

Initially, the circuit has a frequency target of 100 megahertz (MHz). In Step 700 a user-defined margin value M=100 ps is set to take into account additional skew in the clock tree. In Step 702 the time period is decreased by 10%, i.e. the period is decreased from 10 nanoseconds (ns) to 90% of 10 ns=9 ns. This is equivalent to stating that the frequency target has been increased from 100 MHz to ⅑ ns=111 MHz. With an increase in the frequency in the STA environment, Step 704 determines new timing violations—finding all the violating endpoints and their corresponding slack values.

Figure 8:
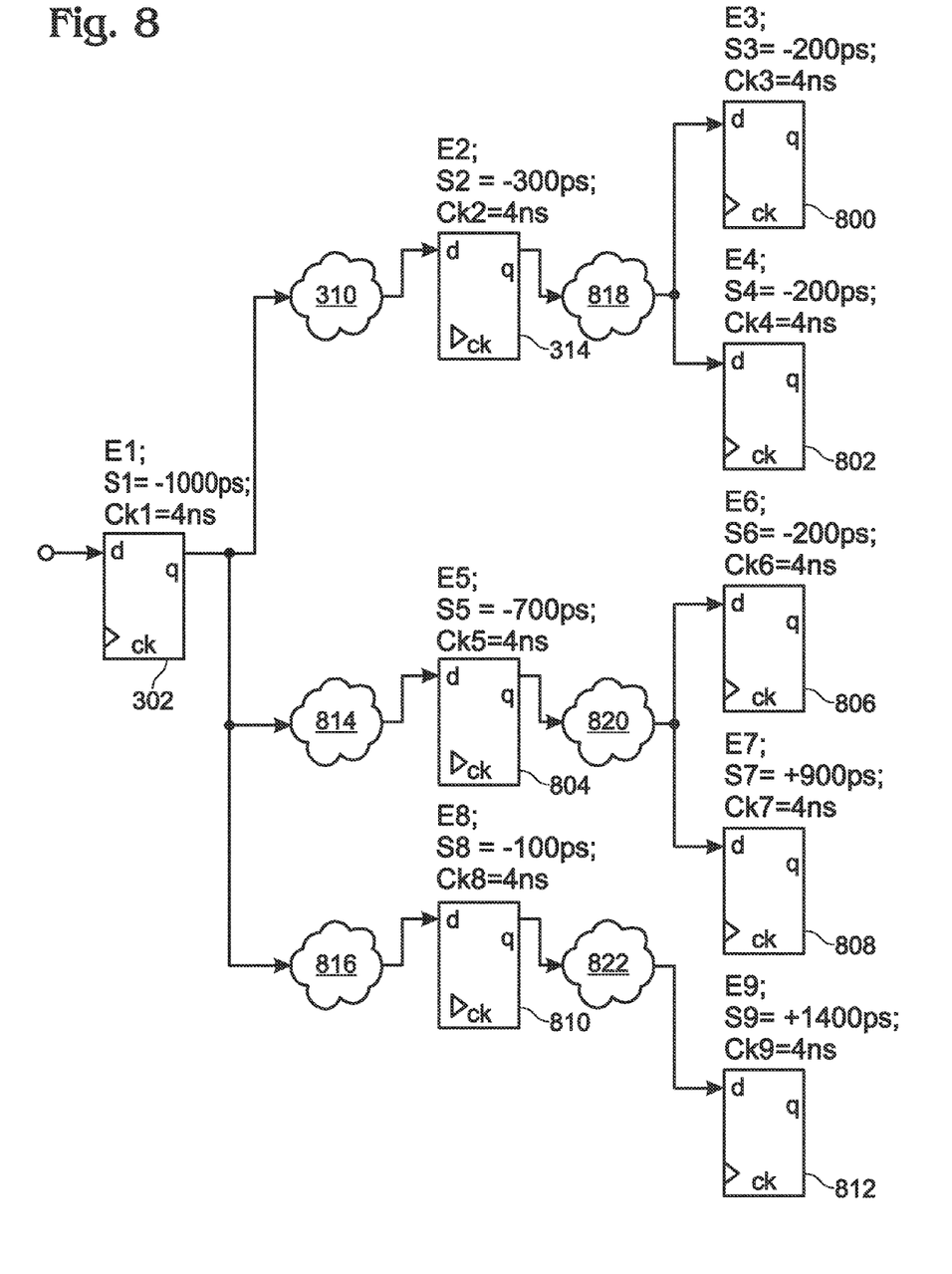
FIG. 8 is a schematic block diagram used to help illustrate the process presented in FIG. 7.

FIG. 8 is a schematic block diagram used to help illustrate the process presented in FIG. 7. Shown are first gate 302 (E1), second gate 314 (E2), third gate 800 (E3), fourth gate 802 (E4), fifth gate 804 (E5), sixth gate 806 (E6), seventh gate 808 (E7), eighth gate 810 (E8), ninth gate 812 (E9), first circuit element 310, second circuit element 814, third circuit element 816, fourth circuit element 818, fifth circuit element 820, and sixth circuit element 822.

Contrasting FIGS. 7 and 8, Step 706 delays the clock $CK_i$ by $(|S_i|+M)$ for every $E_i$, i.e. the endpoint E1's clock pin Ck1 should be delayed by (|−1000 ps|+100 ps)=1100 ps. Note: the clock delay devices depicted in FIG. 3 are omitted in this figure.

Figure 9:
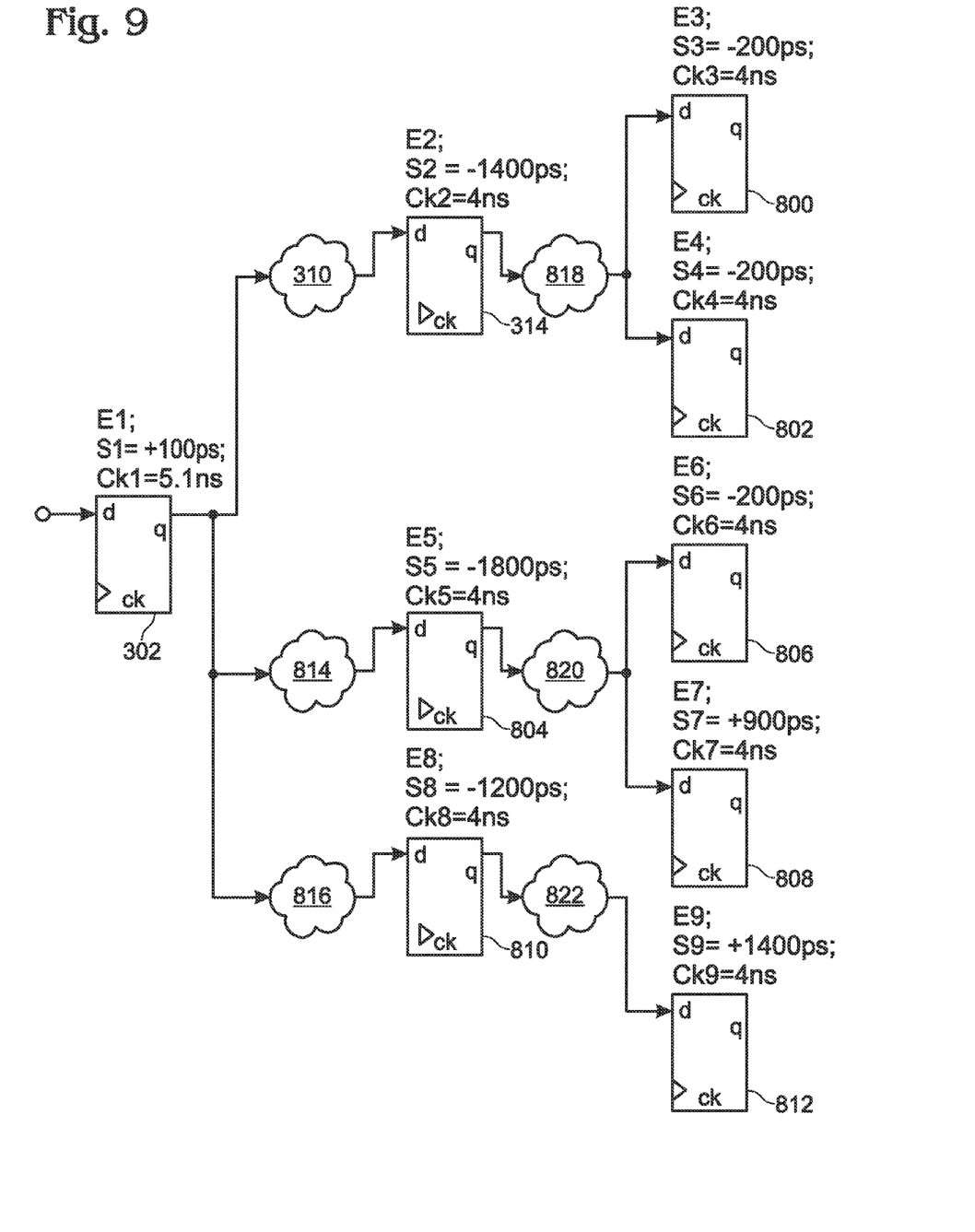
FIG. 9 is a schematic block diagram depicting the system of FIG. 8 with updated timing.

FIG. 9 is a schematic block diagram depicting the system of FIG. 8 with updated timing. Since Ck1 has been delayed by 1.1 ns, its corresponding endpoints violate timing by an additional 1.1 ns, so the negative slack times of E2, E5 and E8 have increased by 1.1 ns.

In Step 708 (FIG. 7), endpoints are found that have a slack of less than 0 with E1 as the startpoint. So the timing endpoints now under consideration are E2, E5, and E8. In Step 710 a check is made to determine if there are any violating endpoints. If no, the process goes to Step 702, else, go to Step 712. In the example of FIG. 9 there are violations, so the process goes to Step 712. In Step 712 a check is made to determine if the gate under consideration (Ei) is an interface port of the chip—a final endpoint.

In order to do so, Step 714 advances all the Cki's delayed earlier in the sequence of gates by the value equal to the negative slack value of the port. Otherwise, Step 728 keeps on delaying the Cki by the |Si| value (if the slack is negative) until a positive slack is achieved in the design with the new optimized frequency. When an interface port is reached and the slack is not zero, Step 718 checks the slack in the design and finds all the violating startpoints Bi. Step 718 advances the clock CKi by $(|S_i|+M)$ for every Bi. Step 722 checks if, after each advancing of the clock CKi, the slack in the design is positive (or the number of failing startpoints is zero). If so (Step 722), it means that all the paths in the design have reached a positive slack with the new optimized frequency and a new improved frequency can be targeted now (Step 702). If not, then Step 724 checks whether an interface input port has been reached with a negative slack. If yes, (Step 726) then with the new optimized frequency cannot be achieved in the design and the clock must be reverted back to its previous frequency. In this example, E2, E5, and E8 are violating (the slack is negative), so Ck2, Ck5, and Ck8 need to be delayed by their corresponding modulus of slack values, i.e. 1400 ps, 1800 ps, and 1200 ps, respectively.

Figure 10:
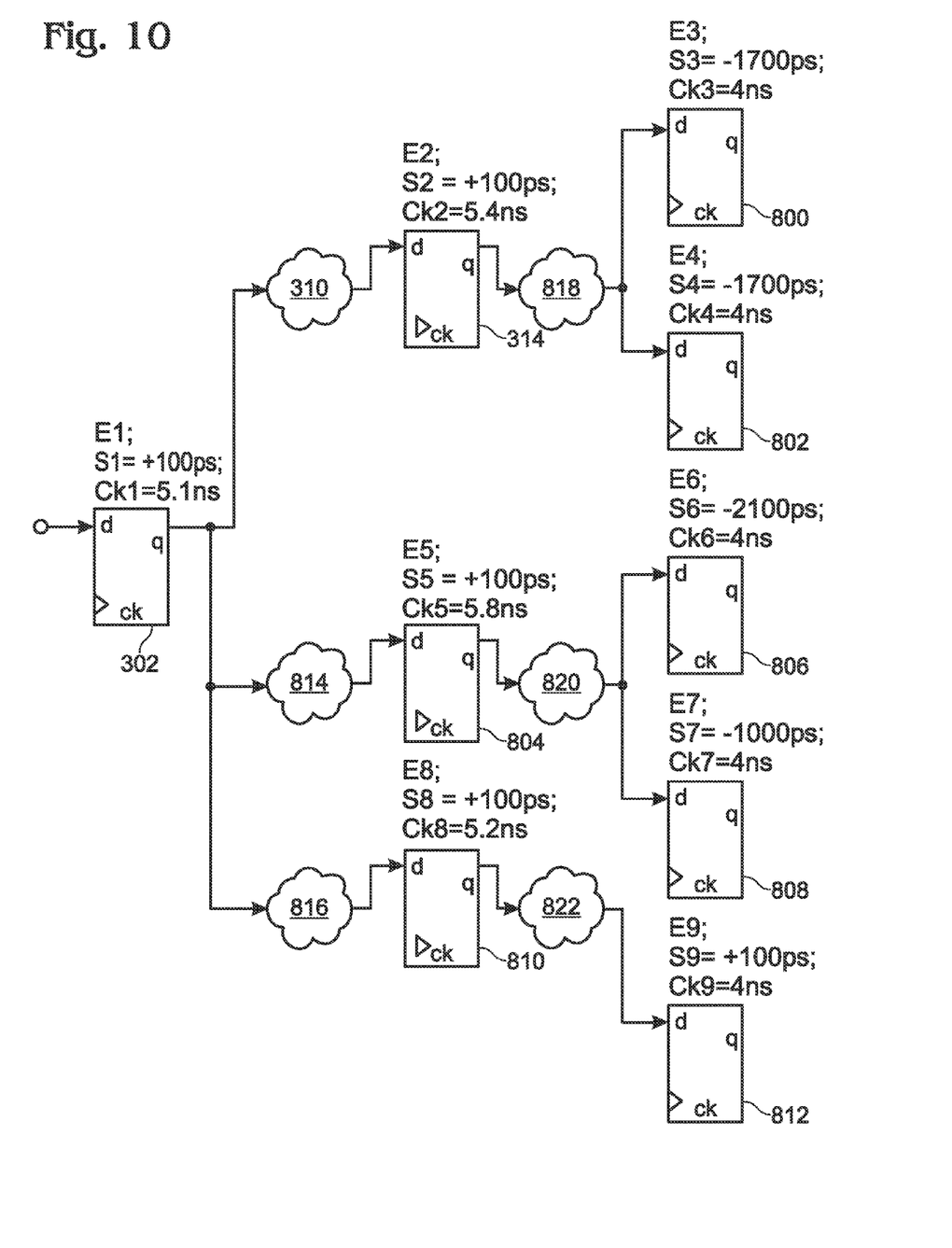
FIG. 10 is a schematic block diagram of the system of FIG. 9 with updated timing values.

FIG. 10 is a schematic block diagram of the system of FIG. 9 with updated timing values. As can be seen in the figure, the endpoints E3, E4, E6, and E7 have negative slack, so the algorithm continues for them (to Step 712) while for the endpoint E9, the slack is positive, so the algorithm stops for E9 at this point only.

In this way, the increase in frequency is targeted by delaying the clocks for the gates. If the slack becomes positive, then the algorithm goes to Step 702 (increasing the frequency further). If not, then the algorithm proceeds towards advancing the clocks of the launch flops.

All the launch clocks of the violating timing paths are advanced similar to what is done in delaying the clocks recursively. If at any point the algorithm reaches a port with negative slack, it means that the frequency target is not possible and the algorithm stops.

In the above algorithm, it can be seen that an increase in frequency while designing the chip is achieved by redistributing the negative slack in the chip and compensating for it with the positive slack present in the pipeline stages.

Figure 11:
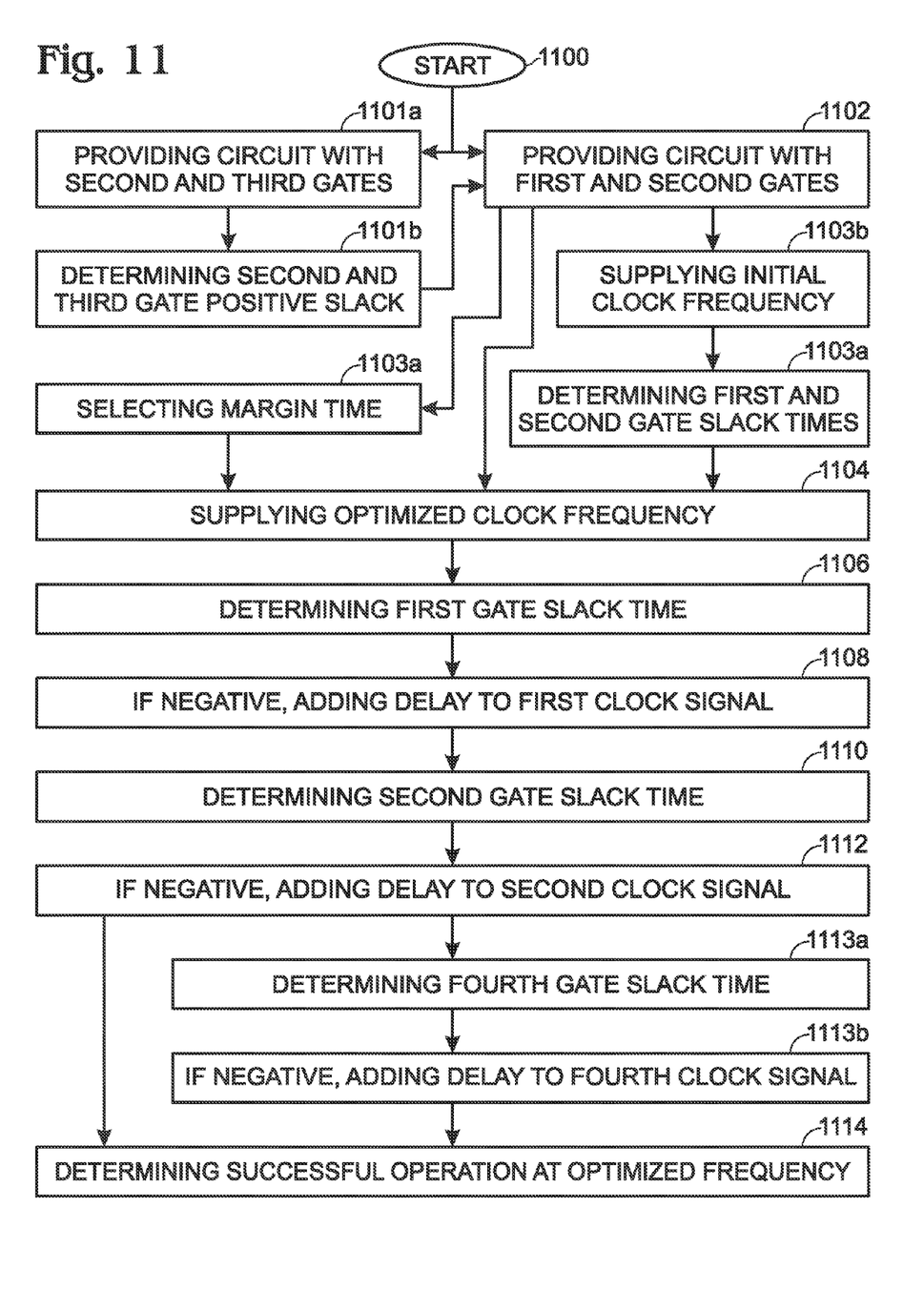
FIG. 11 is a flowchart illustrating a circuit analysis tool, enabled with software instructions stored in a computer-readable medium and executed by a processor, for optimizing circuit clock operating frequency using useful skew timing analysis.

FIG. 11 is a flowchart illustrating a circuit analysis tool, enabled with software instructions stored in a computer-readable medium and executable by a processor, for optimizing circuit clock operating frequency using useful skew timing analysis. The use of computers to read and execute instructions from memory is well known in the art, and the instructions are not limited to any particular protocol or computer hardware.

Various steps in the instructions may be referred to as a "component," "module," "system," and the like, and are intended for use with an automated computing system entity, such as hardware, firmware, a combination of hardware and software, software, software stored on a computer-readable medium, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

The instructions described herein are stored on a physical memory medium or computer-readable medium. As used herein, the term "computer-readable medium" refers to any medium that participates in providing instructions to a processor for execution. Such a medium may take many forms, including but not limited to, non-volatile media, volatile media, and transmission media. Non-volatile media includes, for example, optical or magnetic disks. Volatile media includes dynamic memory. Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Although the method performed by the instructions is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The instructions start at Step 1100.

Step 1102 provides a circuit having a first gate with a signal input to accept a test signal, a clock input, and a signal output. The circuit has a first circuit element with an input connected to the first gate output, an output, and first timing delay between the input and the output. A second gate having a signal input is connected to the first circuit element output. The second gate has a clock input and a signal output. In some aspects, the circuit analysis tool may suggest circuit components and component variables. In other aspects, the circuit components are input by a user. Step 1104 supplies a clock signal with an optimized operating frequency. Step 1106 determines a first gate signal input slack time with respect to the clock signal to the first gate. If the first gate signal input has a negative slack time, which is a time occurring subsequent to the clock signal to the first gate, Step 1108 adds a delay to the first clock signal necessary to create a first gate signal input positive slack time, which is a time occurring before the clock signal to the first gate. Step 1110 determines a second gate signal input slack time with respect to the clock signal to the second gate. If the second gate signal input slack time is negative, Step 1112 adds a delay to the second clock signal necessary to create a second gate signal input positive slack time. In response to the first and second gate signal input positive slack times, Step 1114 determines that the circuit successfully operates at the clock optimized operating frequency.

Step 1103*b* initially supplies a clock signal with an initial operating frequency, which is lower than the optimized operating frequency. Step 1103*c* determines first and second gate signal input positive slack times. Then, supplying the clock signal in Step 1104 includes changing the clock signal from the initial operating frequency to the optimized operating frequency.

In another aspect, Step 1103*a* selects a margin time, and determining the first and second gate signal input positive slack times in Steps 1106 and 1110, respectively, includes determining a slack time occurring at least the margin time before the occurrence of the respective gate clock signals.

In a different aspect, Step 1101*a* initially provides the circuit with a third gate, instead of the first gate. The third gate has a threshold voltage and associated leakage current, a clock input, and a signal input to accept the test signal. If Step 1101*b* determines third and second gate positive signal input slack times, then Step 1102 can replace the third gate with the first gate, where the first gate has a threshold voltage higher than the third gate, and a leakage current lower than the third gate.

In another aspect, Step 1102 provides a second circuit element having an input connected to the first gate output, and an output, and timing delay between the input and the output. A fourth gate has a signal input connected to the second circuit element output, a clock input, and a signal output. Step 1113*a* determines a fourth gate signal input slack time with respect to the clock signal to the fourth gate. If the fourth gate signal input slack time is negative, Step 1113*b* adds a delay to the fourth gate clock signal necessary to create a fourth gate signal input positive slack time. Then, in response to the fourth gate signal input positive slack time, Step 1114 determines that the circuit successfully operates at the clock optimized operating frequency.

Systems and methods have been provided for useful skew timing circuit analysis. Particular circuit elements and process steps have been used to illustrate the invention, but the invention is not necessarily limited to just these examples. Other variations and embodiments of the invention will occur to those skilled in the art.

We claim:

1. A method for adjusting circuit clock operating frequency using skew timing analysis, comprising:
   generating, by a system including a processor, a clock signal with a first operating frequency;
   determining a first slack time of a first gate signal input of a first gate with respect to the clock signal, wherein the first gate comprises a first signal input to accept a test signal, a first clock input to accept the clock signal, and a first signal output connected to an input of a first circuit element;

in response to a determination that the first slack time is negative relative to the clock signal applied to the first clock input of the first gate, adding a first delay to the clock signal applied to the first clock input to yield a first clock signal provided to the first gate to create a first gate signal input positive slack time for the first gate;

determining a second slack time of a second gate signal input of a second gate with respect to the clock signal subsequent to the adding the first delay, wherein the second gate comprises a second signal input connected to an output of the first circuit element, a second clock input to accept the clock signal, and a second signal output; and in response to a determination that the second slack time is negative relative to the clock signal applied to the second clock input and that the second gate is not an interface port, adding a second delay to the clock signal applied to the second clock input to yield a second clock signal provided to the second gate to create a second gate signal input positive slack time for the second gate; and in response to a determination that the second slack time is negative relative to the clock signal applied to the second clock input and that the second gate is an interface port, advancing the first clock signal based on a value of the second slack time.

2. The method of claim 1, further comprising:

generating the clock signal with an initial operating frequency prior to adding the first delay and the second delay; and changing the initial operating frequency to a second operating frequency based on the first gate signal input positive slack time and the second gate signal input positive slack time.

3. The method of claim 2, further comprising:

receiving margin selection input that specifies a margin time; and determining the first delay and the second delay based on determined respective slack times that occur at least the margin time before occurrence of the clock signal applied to the first clock input and the second clock input, respectively.

4. The method of claim 1, further comprising:

replacing the first gate with a third gate having a threshold voltage higher than the first gate and a leakage current lower than the first gate.

5. The method of claim 1, further comprising:

determining a third slack time of a third gate signal input of a third gate with respect to the clock signal, wherein the third gate comprises a third signal input connected to an output of a second circuit element, a third clock input to accept the clock signal, and a third signal output;

in response to a determination that the third slack time is negative, adding a third delay to the clock signal applied to the third clock input to yield a third clock signal provided to the third gate to create a third gate signal input positive slack time.

6. The method of claim 1, wherein the determining the first slack time comprises determining the first slack time for a first flip-flop, and the determining the second slack time comprises determining the second slack time for a second flip-flop.

7. A non-transitory computer-readable medium having stored thereon computer-executable instructions that, in response to execution, cause a system including a processor to perform operations, comprising:

generating, by a system including a processor, a clock signal with a first operating frequency;

determining a first slack time of a first gate signal input of a first gate with respect to the clock signal, wherein the first gate comprises a first signal input to accept a test signal, a first clock input to accept the clock signal, and a first signal output connected to an input of a first circuit element;

in response to a determination that the first slack time is negative relative to the clock signal applied to the first clock input of the first gate, adding a first delay to the clock signal applied to the first clock input to yield a first clock signal provided to the first gate to create a first gate signal input positive slack time for the first gate, wherein the first gate signal input positive slack time occurs before the clock signal to the first gate;

determining a second slack time of a second gate signal input of a second gate with respect to the clock signal subsequent to the adding the first delay, wherein the second gate comprises a second signal input connected to an output of the first circuit element, a second clock input to accept the clock signal, and a second signal output; and in response to a determination that the second slack time is negative relative to the clock signal applied to the second clock input and that the second gate is not an interface port, adding a second delay to the clock signal applied to the second clock input to yield a second clock signal provided to the second gate to create a second gate signal input positive slack time for the second gate; and in response to a determination that the second slack time is negative relative to the clock signal applied to the second clock input and that the second gate is an interface port, advancing the first clock signal based on a value of the second slack time.

8. The non-transitory computer-readable medium of claim 7, the operations further comprising:

generating the clock signal with an initial operating frequency prior to adding the first delay and the second delay; and changing the clock signal from the initial operating frequency to a second operating frequency based on the first gate signal input positive slack time and the second gate signal input positive slack time.

9. The non-transitory computer-readable medium of claim 8, further comprising:

receiving margin selection input that specifies a margin time; and determining the first delay and the second delay based on a determined respective slack times that occur at least the margin time before occurrence of the clock signal applied to the first clock input and the second clock input, respectively.

10. The non-transitory computer-readable medium of claim 7, the operations further comprising:

determining a third slack time of a third gate signal input of a third gate with respect to the clock signal, wherein the third gate comprises a third signal input connected to an output of a second circuit element, a third clock input to accept the clock signal, and a third signal output;

in response to a determination that the third slack time is negative, adding a third delay to the clock signal applied to the third clock input to yield a third clock signal provided to the third gate to create a third gate signal input positive slack time.

* * * * *